(12) United States Patent
Wu

(10) Patent No.: US 9,473,119 B2
(45) Date of Patent: Oct. 18, 2016

(54) LATCH AND FREQUENCY DIVIDER

(71) Applicant: Spreadtrum Communications (Shanghai) Co., Ltd., Shanghai (CN)

(72) Inventor: Yiqiang Wu, Shanghai (CN)

(73) Assignee: SPREADTRUM COMMUNICATIONS (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 14/642,645

(22) Filed: Mar. 9, 2015

(65) Prior Publication Data
US 2016/0126937 A1    May 5, 2016

(30) Foreign Application Priority Data
Oct. 31, 2014    (CN) .......................... 2014 1 0608586

(51) Int. Cl.
*H03K 3/356*    (2006.01)
*H03K 3/012*    (2006.01)
*H03K 5/04*    (2006.01)

(52) U.S. Cl.
CPC .............. *H03K 3/356* (2013.01); *H03K 3/012* (2013.01); *H03K 5/04* (2013.01)

(58) Field of Classification Search
CPC .... H03K 5/133; H03K 5/0375; H03K 5/156; H03K 19/0013; H03K 2005/00026; H03K 2005/00039; H03K 2005/00202
USPC .......................... 327/199, 200, 201, 202, 333
See application file for complete search history.

(56) References Cited

U.S. PATENT DOCUMENTS

| | | | | |
|---|---|---|---|---|
| 5,486,785 A * | 1/1996 | Blankenship | .... | H03K 3/356034 326/33 |
| 2006/0192604 A1* | 8/2006 | Ramaraju | ........ | H03K 3/356008 327/199 |
| 2010/0201425 A1* | 8/2010 | Ku | ................... | H03K 3/356113 327/333 |

* cited by examiner

*Primary Examiner* — John Poos
(74) *Attorney, Agent, or Firm* — Vierra Magen Marcus LLP

(57) ABSTRACT

A latch and a frequency divider are provided. The latch includes: a first logic cell coupled between a power supply and a ground wire, wherein the first logic cell has a first control terminal, a first input terminal and a first output terminal; a second logic cell having a structure symmetrical to that of the first logic cell; wherein the second logic cell has a second control terminal, a second input terminal and a second output terminal; and a feedforward control unit adapted to control the first logic cell or the second logic cell based on signals inputted into the first input terminal and the second input terminal. Accordingly, current loss under static working conditions of a latch can be eliminated, and current loss under dynamic working conditions of the latch can be reduced.

23 Claims, 20 Drawing Sheets

LATCH AND FREQUENCY DIVIDER

CROSS-REFERENCE TO RELATED APPLICATIONS

The present application claims priority to Chinese patent application No. 201410608586.X, filed on Oct. 31, 2014, and entitled "LATCH AND FREQUENCY DIVIDER", the entire disclosure of which is incorporated herein by reference.

TECHNICAL FIELD

The present disclosure generally relates to semiconductor technology, and more particularly, to a latch and a frequency divider.

BACKGROUND

High speed frequency dividers which are based on latches have been widely used, because of better performance such as high speed and wide bandwidth thereof.

For example, a high speed frequency divider, which can achieve two divided frequencies, requires two latches, such as a first latch and a second latch, wherein the first latch servers as a follow-up stage of the second latch and the second latch servers as a follow-up stage of the first stage.

However, in existing frequency dividers, when signals inputted into the control terminal are in low level, a current circuit will be formed in the latch of the frequency divider both in static working condition and in dynamic working condition. Accordingly, power consumption will be enlarged.

SUMMARY

According to one embodiment of the present disclosure, a latch is provided. The latch includes: a first logic cell coupled between a power supply and a ground wire, which has a first control terminal, a first input terminal and a first output terminal; a second logic cell having a structure symmetrical to that of the first logic cell, which has a second control terminal, a second input terminal and a second output terminal; and a feedforward control unit adapted to control the first logic cell or the second logic cell based on signals inputted into the first input terminal and the second input terminal.

In some embodiments, the feedforward control unit includes at least one selected from a group consisting of a first control sub-unit, a second control sub-unit, a third control sub-unit, and a fourth control sub-unit; wherein the first control sub-unit is adapted to cut off a first current circuit in the first logic cell, when the signal inputted into the first input terminal is in high level and the signal inputted into the second input terminal is in low level; the second control sub-unit is adapted to cut off a second current circuit in the second logic cell, when the signal inputted into the first input terminal is in high level and the signal inputted into the second input terminal is in low level; the third control sub-unit is adapted to cut off the first current circuit in the first logic cell, when the signal inputted into the first input terminal is in low level and the signal inputted into the second input terminal is in high level; and the fourth control sub-unit is adapted to cut off the second current circuit in the second logic cell, when the signal inputted into the first input terminal is in low level and the signal inputted into the second input terminal is in high level.

In some embodiments, wherein the first logic cell includes a first transistor, a third transistor and a fifth transistor; the second logic cell includes a second transistor, a fourth transistor and a sixth transistor; a source of the first transistor is coupled with the power supply, a gate of the first transistor is coupled with the first control terminal, a drain of the first transistor is coupled with a drain of the third transistor, a drain of the fifth transistor, a gate of the fourth transistor and the first output terminal; a source of the second transistor is coupled with the power supply, a gate of the second transistor is coupled with the second control terminal, a drain of the second transistor is coupled with a drain of the fourth transistor, a drain of the sixth transistor, a gate of the third transistor and the second output terminal; and sources of the third transistor, the fourth transistor, the fifth transistor and the sixth transistor are coupled with the ground wire.

In some embodiments, the first control sub-unit includes a seventh transistor which is a PMOS transistor; and a source of the seventh transistor is coupled with the drain of the first transistor, a gate of the seventh transistor is coupled with the first input terminal, a drain of the seventh transistor is coupled with the drain of the third transistor, the drain of the fifth transistor, the gate of the fourth transistor and the first output terminal.

In some embodiments, the first control sub-unit further includes an eighth transistor which is a PMOS transistor; and a source of the eighth transistor is coupled with the drain of the second transistor, a gate of the eighth transistor is coupled with the second input terminal, a drain of the eighth transistor is coupled with the drain of the fourth transistor, the drain of the sixth transistor, the gate of the third transistor and the second output terminal.

In some embodiments, the source of the seventh transistor and the source of the eighth transistor are coupled with each other.

In some embodiments, the first control sub-unit includes a seventh transistor which is a PMOS transistor; and a source of the seventh transistor is coupled with the power supply, a gate of the seventh transistor is coupled with the first input terminal, a drain of the seventh transistor is coupled with the source of the first transistor.

In some embodiments, the first control sub-unit further includes an eighth transistor which is a PMOS transistor; and a source of the eighth transistor is coupled with the power supply, a gate of the eighth transistor is coupled with the second input terminal, a drain of the eighth transistor is coupled with the source of the second transistor.

In some embodiments, the second control sub-unit includes a ninth transistor which is an NMOS transistor; and a drain of the ninth transistor is coupled with the drain of the second transistor, a gate of the ninth transistor is coupled with the first input terminal, a source of the ninth transistor is coupled with the drain of the fourth transistor, the drain of the sixth transistor, the gate of the third transistor and the second output terminal.

In some embodiments, the second control sub-unit further includes a tenth transistor which is an NMOS transistor; and a drain of the tenth transistor is coupled with the drain of the first transistor, a gate of the tenth transistor is coupled with the second input terminal, a source of the tenth transistor is coupled with the drain of the third transistor, the drain of the fifth transistor, the gate of the fourth transistor and the first output terminal.

In some embodiments, the drain of the ninth transistor and the source of the tenth transistor are coupled with each other.

In some embodiments, the second control sub-unit includes a ninth transistor which is an NMOS transistor; and a drain of the ninth transistor is coupled with the power supply, a gate of the ninth transistor is coupled with the first input terminal, a source of the ninth transistor is coupled with the source of the second transistor.

In some embodiments, the second control sub-unit further includes a tenth transistor which is an NMOS transistor; and a drain of the tenth transistor is coupled with the power supply, a gate of the tenth transistor is coupled with the second input terminal, a source of the tenth transistor is coupled with the source of the first transistor.

In some embodiments, the third control sub-unit includes an eleventh transistor which is a PMOS transistor; and a source of the eleventh transistor is coupled with the drain of the first transistor, a gate of the eleventh transistor is coupled with the first input terminal, a drain of the eleventh transistor is coupled with the drain of the third transistor, the drain of the fifth transistor, the gate of the fourth transistor and the first output terminal.

In some embodiments, the third control sub-unit further includes a twelfth transistor which is a PMOS transistor; and a source of the twelfth transistor is coupled with the drain of the second transistor, a gate of the twelfth transistor is coupled with the second input terminal, a drain of the twelfth transistor is coupled with the drain of the fourth transistor, the drain of the sixth transistor, the gate of the third transistor and the second output terminal.

In some embodiments, the source of the eleventh transistor and the source of the twelfth transistor are coupled with each other.

In some embodiments, the third control sub-unit includes an eleventh transistor which is a PMOS transistor; and a source of the eleventh transistor is coupled with the power supply, a gate of the eleventh transistor is coupled with the first input terminal, a gate of the eleventh transistor is coupled with the source of the first transistor.

In some embodiments, the third control sub-unit further includes a twelfth transistor which is a PMOS transistor; and a source of the twelfth transistor is coupled with the power supply, a gate of the twelfth transistor is coupled with the second input terminal, a gate of the twelfth transistor is coupled with the source of the second transistor.

In some embodiments, the fourth control sub-unit includes a thirteenth transistor which is an NMOS transistor; and a drain of the thirteenth transistor is coupled with the drain of the second transistor, a gate of the thirteenth transistor is coupled with the first input terminal, a source of the thirteenth transistor is coupled with the drain of the fourth transistor, the drain of the sixth transistor, the gate of the third transistor and the second output terminal.

In some embodiments, the fourth control sub-unit further includes a fourteenth transistor which is an NMOS transistor; and a drain of the fourteenth transistor is coupled with the drain of the first transistor, a gate of the fourteenth transistor is coupled with the second input terminal, a source of the fourteenth transistor is coupled with the drain of the third transistor, the drain of the fifth transistor, the gate of the fourth transistor and the first output terminal.

In some embodiments, the drain of the thirteenth transistor and the source of the fourteenth transistor are coupled with each other.

In some embodiments, the fourth control sub-unit includes a thirteenth transistor which is an NMOS transistor; and a drain of the thirteenth transistor is coupled with the power supply, a gate of the thirteenth transistor is coupled with the first input terminal, a source of the thirteenth transistor is coupled with the source of the second transistor.

In some embodiments, the third control sub-unit further includes a fourteenth transistor which is an NMOS transistor; and a drain of the fourteenth transistor is coupled with the power supply, a gate of the fourteenth transistor is coupled with the second input terminal, a source of the fourteenth transistor is coupled with the source of the first transistor.

According to one embodiment of the present disclosure, a frequency divider is provided. The frequency divider includes at least two of the latches recited above, wherein the at least two of the latches includes a first latch and a second latch, the first input terminal and the second input terminal of the first latch are respectively coupled with the first output terminal and the second output terminal of the second latch.

Accordingly, a feedforward control unit is applied to cut off current circuits between the power supply and the ground wire based on differential signals inputted into the first input terminal and the second input terminal of the latch.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Figure 1:
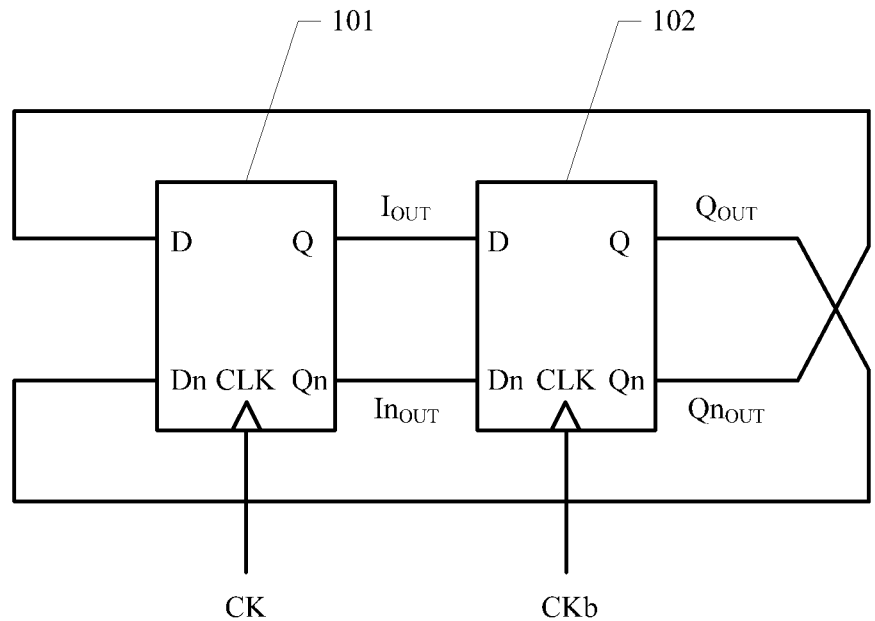
FIG. 1 schematically illustrates a structure of an existing frequency divider.

Referring to FIG. 1, an existing high speed frequency divider is illustrated. The high speed frequency divider includes a first latch 101 and a second latch 102, wherein the first latch 101 servers as a follow-up stage of the second latch 102, and the second latch 102 servers as a follow-up stage of the second latch 101 as well.

When the high speed frequency divider can achieve two divided frequencies, frequency of signals outputted from the frequency divider is one half that of signals inputted into the high speed frequency divider. Thus, the signals output from the high speed frequency divider are orthogonal signals and have a duty ratio of 25% or 75%.

Figure 2:
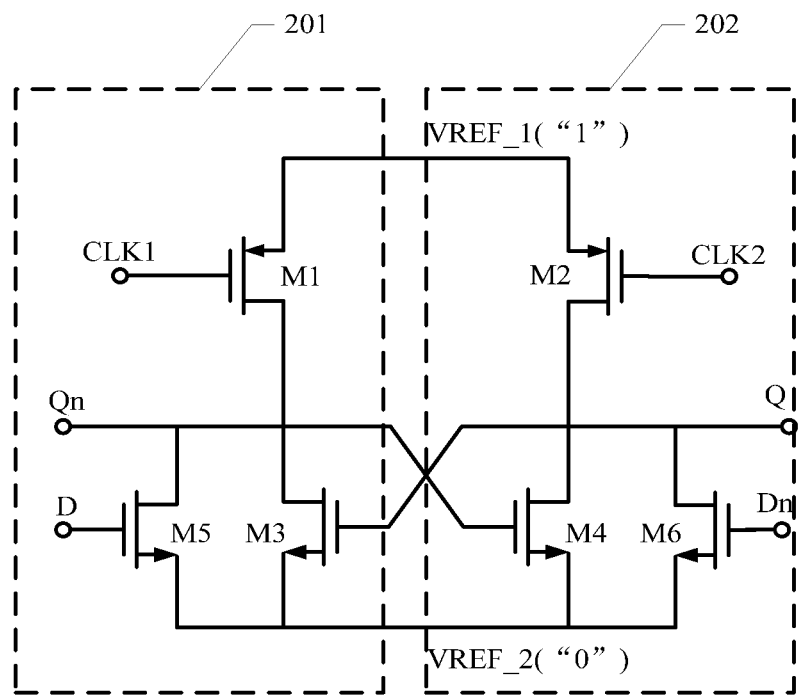
FIG. 2 schematically illustrates a structure of a latch in an existing frequency divider.

Referring to FIG. 2, a latch of an existing high speed frequency divider is illustrated, where the high speed frequency divider has two divided frequencies and a duty ratio of 25%. As shown, the latch 200 includes a first logic cell 201 and a second logic cell 202, wherein the first logic cell 201 and the second logic cell 202 are both connected between a power supply VREF_1 and a ground wire VREF_2.

The first logic cell 201 has a first control terminal CLK1, a first input terminal D and a first output terminal Qn, and the second logic cell 202 has a second control terminal CLK2, a second input terminal Dn and a second output terminal Q.

The first logic cell 201 includes a first transistor M1, a third transistor M3, and a fifth transistor M5. The second logic cell 202 includes a second transistor M2, a fourth transistor M4, and a sixth transistor M6. The first transistor M1 and the second transistor M2 are PMOS (P-channel Metal Oxide Semiconductor) transistors. The third transistor M3, the fourth transistor M4, the fifth transistor M5 and the sixth transistor M6 are NMOS (N-channel Metal Oxide Semiconductor) transistors.

Source of the first transistor M1 and source of the second transistor M2 are coupled with a power supply VREF_1. Gate of the first transistor M1 and gate of the second transistor M2 are respectively coupled with the first control terminal CLK1 and the second control terminal CLK2. Drain of the first transistor M1 is coupled with drain of the third transistor M3, drain of the fifth transistor M5, the first output terminal Qn, and gate of the fourth transistor M4. Drain of the second transistor M2 is coupled with drain of the fourth transistor M4, drain of the sixth transistor M6, the second output terminal Q and gate of the third transistor M3. Sources of the third transistor M3, the fourth transistor M4, the fifth transistor M5, and the sixth transistor M6 are coupled with a ground wire VREF_2.

When the first control terminal CLK1 and the second control terminal CLK2 are both in low level ("0"), the first transistor M1 and the second transistor M2 are both on, thus a current path from the power supply VREF_1 to the first output terminal Qn and the second output terminal Q is formed. In this case, if input differential signals into the first input terminal D and the second input terminal Dn, for example, make the first input terminal D in high level ("1") and the second input terminal Dn in low level ("0"), signals inputted from the first input terminal will be amplified and outputted from the first output terminal, and signals inputted into the second input terminal will be amplified and outputted from the second output terminal. Therefore, the first output terminal has an electrical level approximately equal to that of the power supply VREF_1, and the second output terminal has an electrical level approximately equal to that of the ground wire VREF_2.

Accordingly, when the first input terminal D in high level ("1") and the second input terminal Dn in low level ("0"), the fifth transistor M5 is on, the sixth transistor M6 is off, the third transistor M3 is on, and the fourth transistor M4 is off. Thus, a direct current path from the power supply VREF_1 to the first transistor M1, the third transistor M3/the fifth transistor M5, and the VREF_2 is formed. Therefore, in this working condition which is a static working condition, current loss will be caused in the latch.

When the first control terminal CLK1 and the second control terminal CLK2 are both in high level ("1"), the first transistor M1 and the second transistor M2 are both off, thus the current path from the power supply VREF_1 to the first output terminal Qn and the second output terminal Q is cut off. The second output terminal Q will discharge through the fifth transistor M5, and the first output terminal Qn will discharge through the sixth transistor M6. Therefore, both the second output terminal Q and the first output terminal Qn have an electrical level approximately equal to that of the ground wire VREF_2. Accordingly, in this working condition which is a dynamic working condition, current loss of the latch will be increased.

Accordingly, in existing frequency dividers, when signals inputted into the control terminal are in low level, the latch will have a current circuit therein both in the static working condition and in the dynamic working condition. Accordingly, power consumption will be enlarged.

Figure 3:
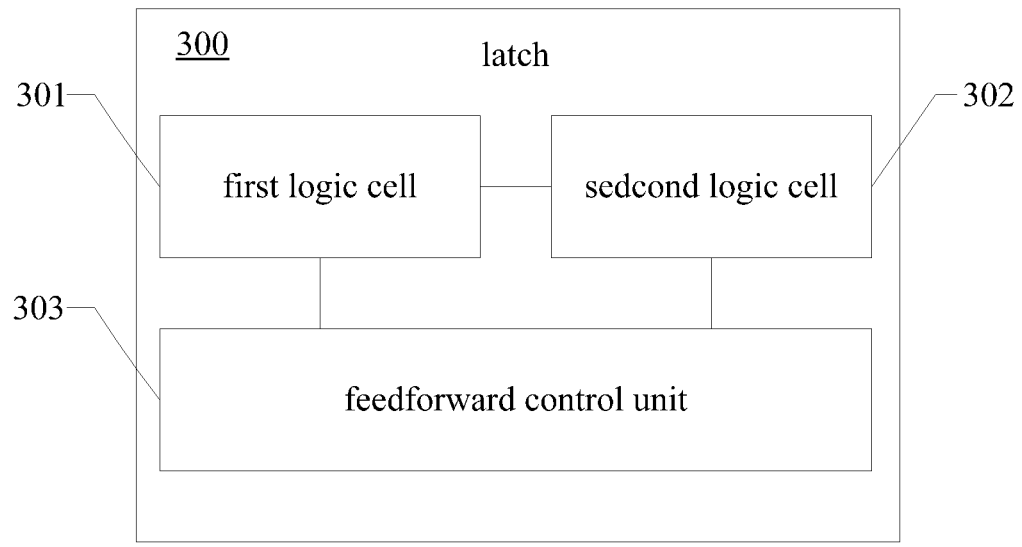
FIG. 3 schematically illustrates a block diagram of a latch according to one embodiment of the present disclosure.

Referring to FIG. 3, a block diagram of a latch according to one embodiment of the present disclosure is illustrated. The latch 300 includes: a first logic cell 301 coupled between a power supply VREF_1 and a ground wire VREF_2; a second logic cell 302 which has a structure symmetrical to that of the first logic cell 301; and a feedforward control unit 303.

The first logic cell 301 has a first control terminal CLK1, a first input terminal D and a first output terminal Qn. The second logic cell 302 has a second control terminal CLK2, a second input terminal Dn and a second output terminal Q.

The feedforward control unit 303 is adapted to: control the first logic cell 301 or the second logic cell 302 based on signals inputted into the first input terminal D of the first logic cell 301 and the second input terminal Dn of the second logic cell 302; wherein controlling the first logic cell 301 includes controlling a first current path in the first logic cell 301 to be cut off, controlling the second logic cell 302 includes controlling a second current path in the second logic cell 301 to be cut off.

Figure 4:
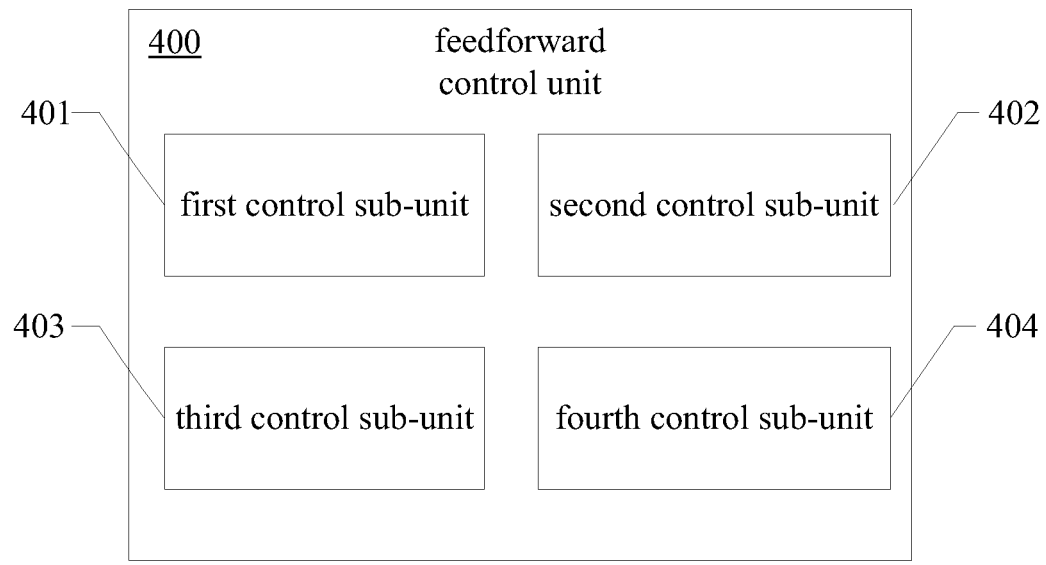
FIG. 4 schematically illustrates a block diagram of a feedforward control unit according to one embodiment of the present disclosure.

Referring to FIG. 4, a block diagram of a feedforward control unit according to one embodiment of the present disclosure is illustrated. The feedforward control unit 400 includes at least one selected from a group consisting of a first control sub-unit 401, a second control sub-unit 402, a third control sub-unit 403 and a fourth control sub-unit 404.

The first control sub-unit 401 is adapted to cut off a first current path in the first logic cell 301, when signals inputted into the first input terminal D and the second input terminal Dn are respectively in high level and low level.

The second control sub-unit 402 is adapted to cut off a second current path in the second logic cell 302, when signals inputted into the first input terminal D and the second input terminal Dn are respectively in high level and low level.

The third control sub-unit 403 is adapted to cut off the first current path in the first logic cell 301, when signals inputted into the first input terminal D and the second input terminal Dn are respectively in low level and high level.

The fourth control sub-unit 404 is adapted to cut off the second current path in the second logic cell 302, when signals inputted into the first input terminal D and the second input terminal Dn are respectively in low level and high level.

Figure 5:
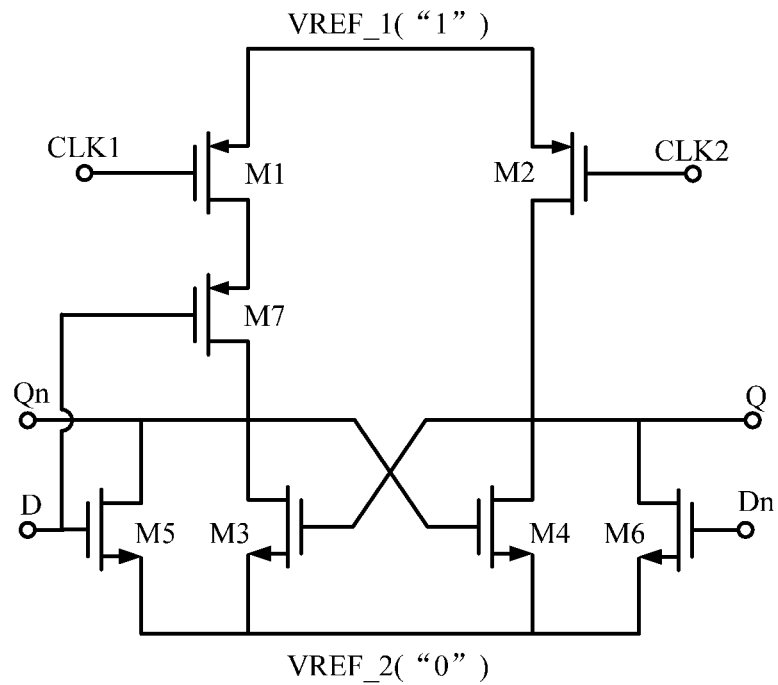
FIGS. 5-24 schematically illustrate different circuit configurations of a latch according to different embodiments of the present disclosure.

Referring to FIG. 5, a circuit configuration of a latch according to one embodiment of the present disclosure is illustrated. The latch includes a first logic cell, a second logic cell and a first control sub-unit, wherein the first control sub-unit includes a seventh transistor M7.

In comparison with the latch 200 illustrated in FIG. 2, the latch as shown in FIG. 5 includes an additional transistor which is the seventh transistor M7. Furthermore, the seventh transistor M7 is a PMOS transistor.

Source of the seventh transistor M7 is coupled with the drain of the first transistor M1. Gate of the seventh transistor M7 is coupled with the first input terminal D. Drain of the seventh transistor M7 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in low level ("0"), the first transistor M1 and the second transistor M2 are both on. In this case, if the first input terminal D in high level ("1") and the second input terminal Dn in low level ("0"), the third transistor M3 and the fifth transistor M5 will be on, the seventh transistor M7 will be off, the fourth transistor M4 and the sixth transistor M6 will be off, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 6:
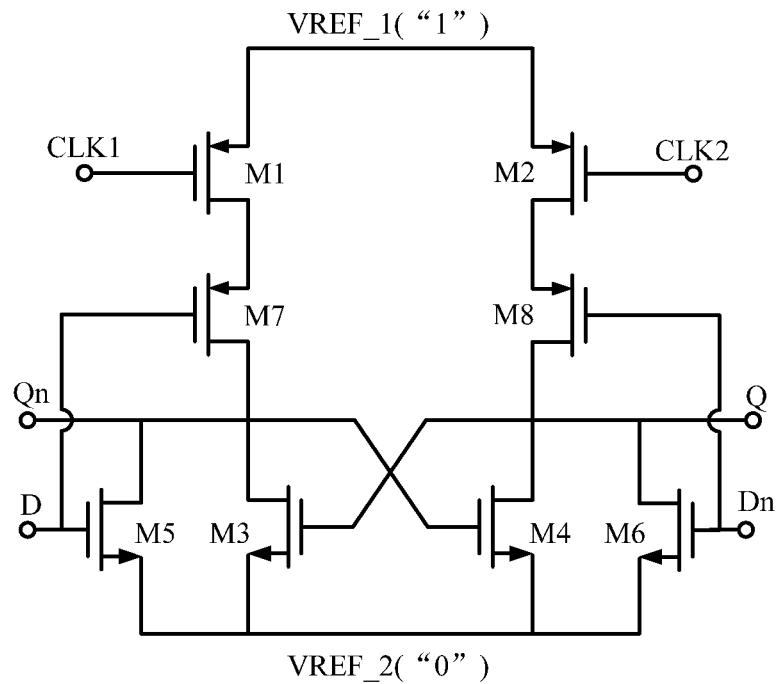

Referring to FIG. 6, a circuit configuration of a latch according to one embodiment of the present disclosure is illustrated. The latch includes a first logic cell, a second logic cell and a first control sub-unit, wherein the first control sub-unit includes a seventh transistor M7 and an eighth transistor M8.

In comparison with the latch illustrated in FIG. 5, the latch as shown in FIG. 6 includes an additional transistor which is the eighth transistor M8.

Source of the eighth transistor M8 is coupled with the drain of the second transistor M2. Gate of the eighth transistor M8 is coupled with the second input terminal Dn. Drain of the eighth transistor M8 is coupled with the drain of the fourth transistor M4, the drain of the sixth transistor M6, the gate of the third transistor M3, and the second output terminal Q.

Accordingly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be on, the seventh transistor M7 will be off, the fourth transistor M4 and the sixth transistor M6 will be off, the eighth transistor M8 will be on, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 7:
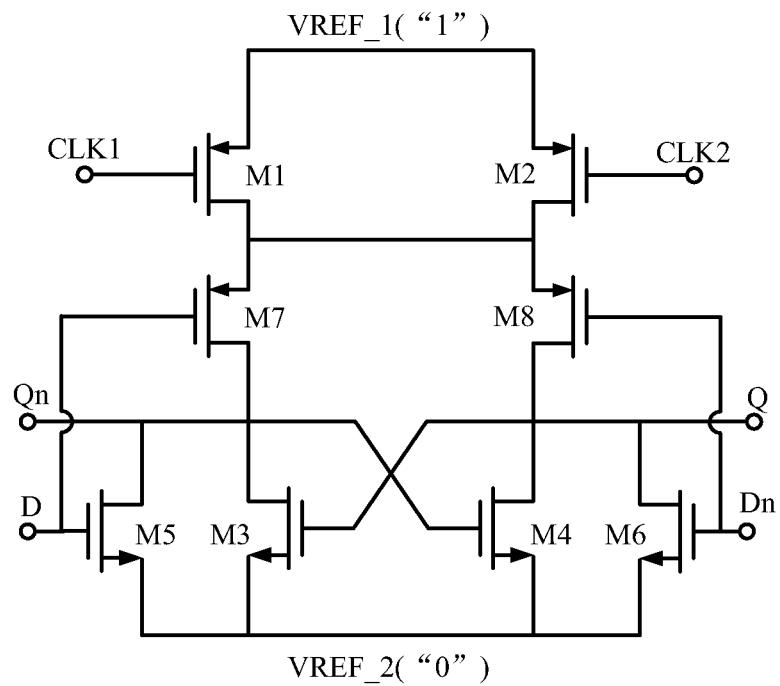

Referring to FIG. 7, a circuit configuration of a latch according to one embodiment of the present disclosure is illustrated. The latch includes a first logic cell, a second logic cell and a first control sub-unit, wherein the first control sub-unit includes a seventh transistor M7 and an eighth transistor M8.

Circuit configuration of the latch as shown in FIG. 7 is a modification of that of the latch as shown in FIG. 6. Specifically, source of the seventh transistor M7 and source of the eighth transistor M8 are coupled with each other.

Similarly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be on, the seventh transistor M7 will be off, the fourth transistor M4 and the sixth transistor M6 will be off, the eighth transistor M8 will be on, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 8:
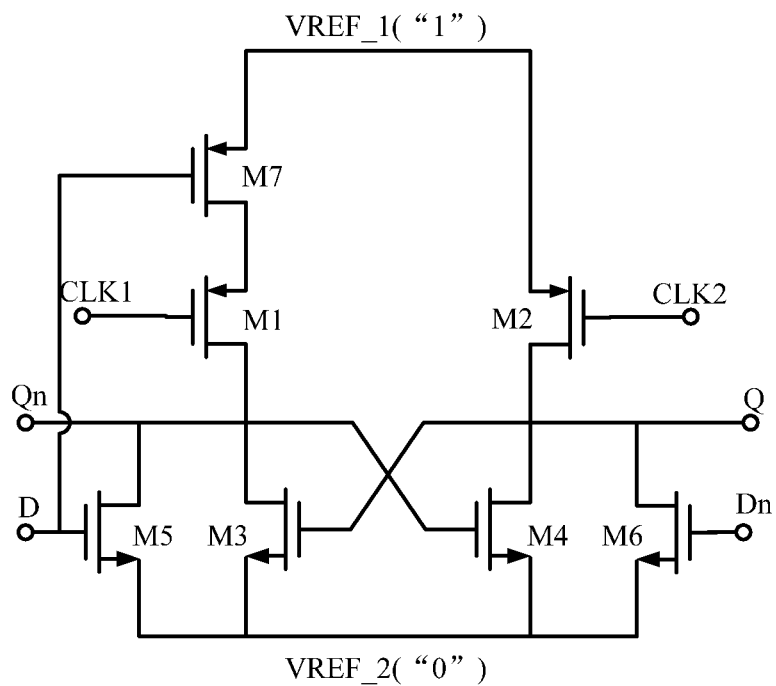

Referring to FIG. 8, a circuit configuration of a latch according to one embodiment of the present disclosure is illustrated. The latch includes a first logic cell, a second logic cell and a first control sub-unit, wherein the first control sub-unit includes a seventh transistor M7. The seventh transistor M7 is a PMOS transistor.

In comparison with the latch 200 illustrated in FIG. 2, the latch as shown in FIG. 8 includes an additional transistor which is the seventh transistor M7.

Source of the seventh transistor M7 is coupled with the power supply VREF_1, gate of the seventh transistor M7 is coupled with the first input terminal D, and drain of the seventh transistor M7 is coupled with the source of the first transistor M1.

Similarly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be on, the seventh transistor M7 will be off, the fourth transistor M4 and the sixth transistor M6 will be off, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 9:
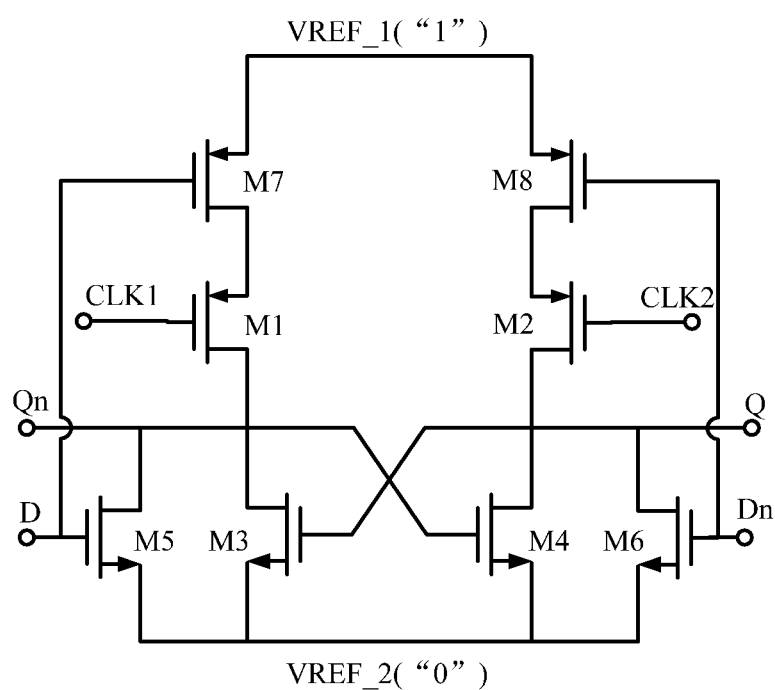

Referring to FIG. 9, a circuit configuration of a latch according to one embodiment of the present disclosure is illustrated. The latch includes a first logic cell, a second logic cell and a first control sub-unit, wherein the first control sub-unit includes a seventh transistor M7 and an eighth transistor M8. The seventh transistor M7 and the eighth transistor M8 are both PMOS transistor.

In comparison with the latch illustrated in FIG. 8, the latch as shown in FIG. 9 includes an additional transistor which is the eighth transistor M8.

Source of the eighth transistor M8 is coupled with the power supply VREF_1, gate of the eighth transistor M8 is coupled with the second input terminal Dn, and drain of the eighth transistor M8 is coupled with the source of the second transistor M2.

Similarly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be on, the seventh transistor M7 will be off, the fourth transistor M4 and the sixth transistor M6 will be off, the eighth transistor M8 will be on, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 10:
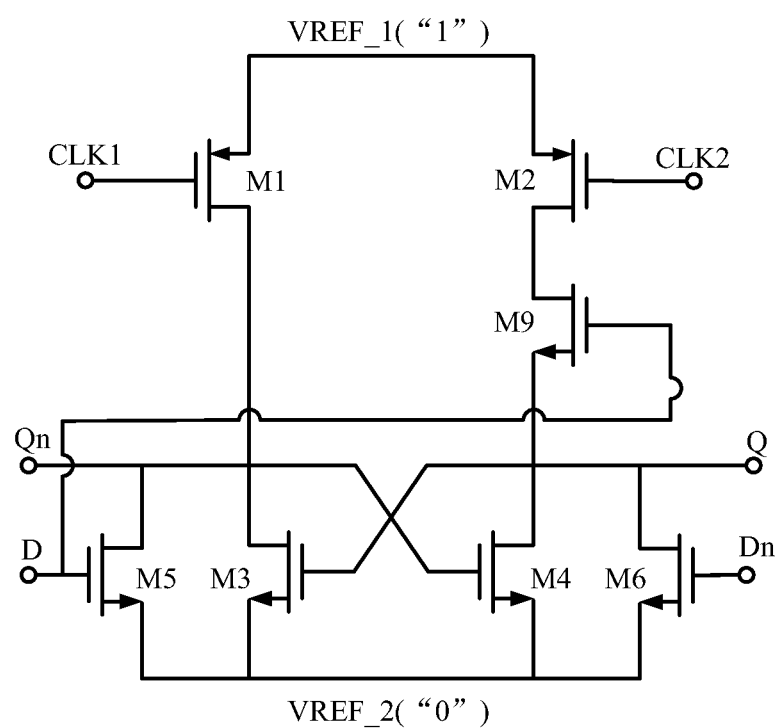

Referring to FIG. 10, a circuit configuration of a latch according to one embodiment of the present disclosure is illustrated. The latch includes a first logic cell, a second logic cell and a second control sub-unit, wherein the second control sub-unit includes a ninth transistor M9.

In comparison with the latch 200 illustrated in FIG. 2, the latch as shown in FIG. 10 includes an additional transistor which is the ninth transistor M9. Furthermore, the ninth transistor M9 is a PMOS transistor.

Drain of the ninth transistor M9 is coupled with the drain of the second transistor M2. Gate of the ninth transistor M9 is coupled with the first input terminal D. Source of the ninth transistor M9 is coupled with the drain of the fourth transistor M4, the drain of the sixth transistor M6, the gate of the third transistor M3, and the second output terminal Q.

Accordingly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be off, the fourth transistor M4 and the sixth transistor M6 will be on, the ninth transistor M9 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 11:
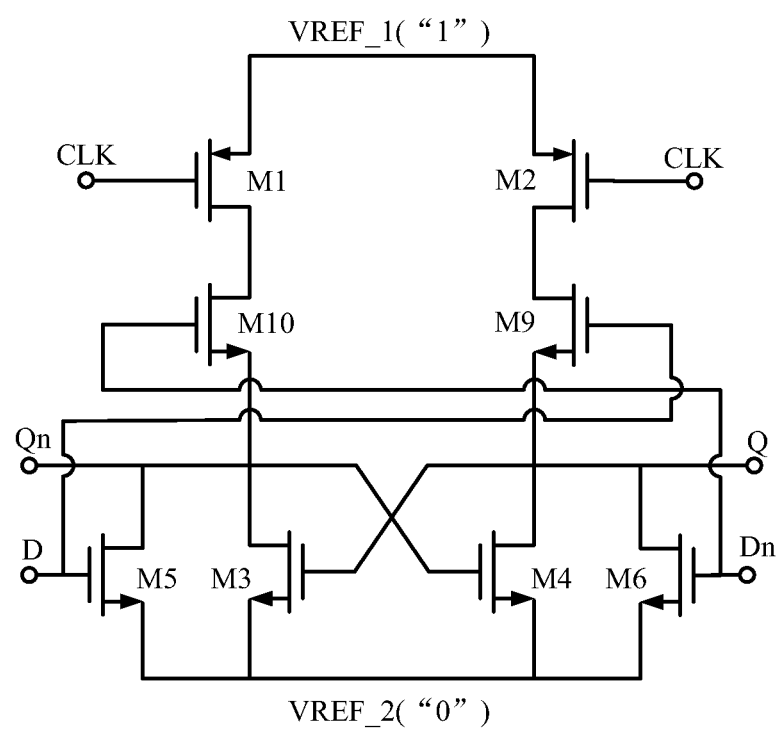

Referring to FIG. 11, a circuit configuration of a latch according to one embodiment of the present disclosure is illustrated. The latch includes a first logic cell, a second logic cell and a second control sub-unit, wherein the second control sub-unit includes a ninth transistor M9 and a tenth transistor M10. The ninth transistor M9 and the tenth transistor M10 are both NMOS transistor.

In comparison with the latch illustrated in FIG. 10, the latch as shown in FIG. 11 includes an additional transistor which is the tenth transistor M10.

Drain of the tenth transistor M10 is coupled with the drain of the first transistor M1. Gate of the tenth transistor M10 is coupled with the second input terminal Dn. Source of the tenth transistor M10 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be off, the tenth transistor M10 will be on, the fourth transistor M4 and the sixth transistor M6 will be on, the ninth transistor M9 will be off, thus a current path from the power supply VREF_1 to the second transistor M2, the fourth transistor M4/the sixth transistor M6, and the ground wire VREF_2 will be cut off, wherein the current path is in the second logic cell. Therefore, when the first control terminal CLK1 and the second control terminal CLK2 are both in low level, the static loss of the latch will be eliminated, and the dynamic loss of the latch will be dramatically reduced.

Figure 12:
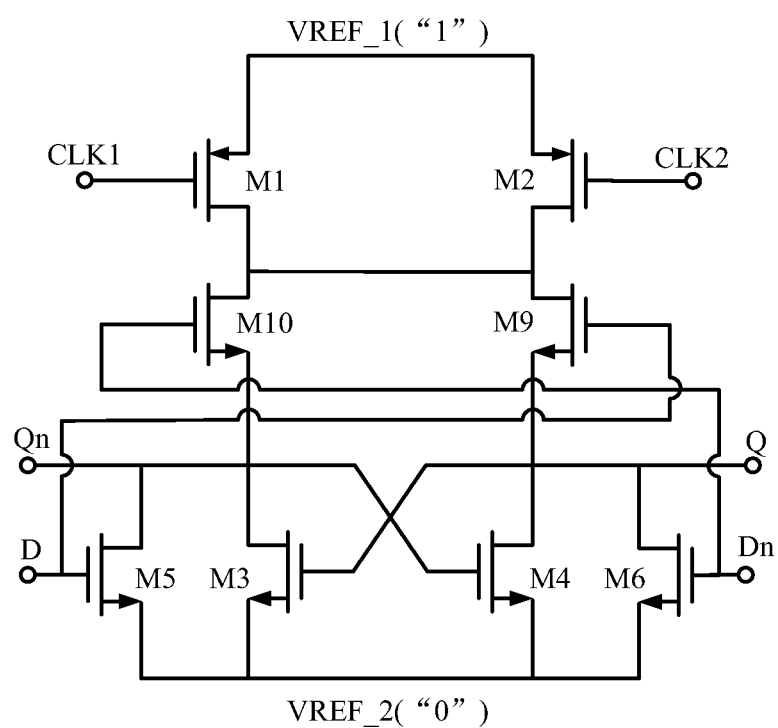

Referring to FIG. 12, a circuit configuration of a latch according to one embodiment of the present disclosure is illustrated. The latch includes a first logic cell, a second logic cell and a second control sub-unit, wherein the second control sub-unit includes a ninth transistor M9 and a tenth transistor M10. The ninth transistor M9 and the tenth transistor M10 are both NMOS transistor.

The latch as shown in FIG. 12 is a modification of the latch as shown in FIG. 11. Specifically, the drain of the ninth transistor M9 and the drain of the tenth transistor M10 are coupled with each other.

Accordingly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be off, the tenth transistor M10 will be on, the fourth transistor M4 and the sixth transistor M6 will be on, the ninth transistor M9 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 13:
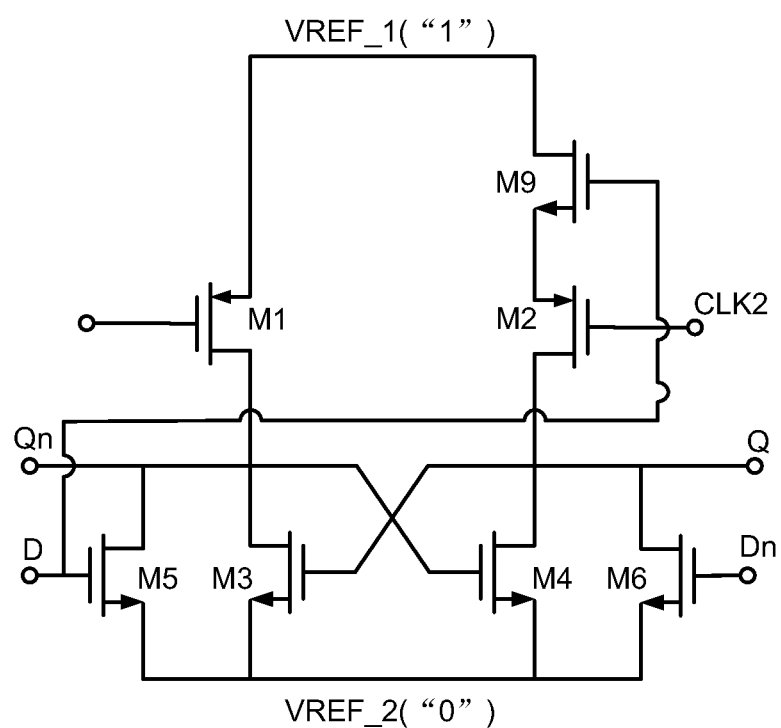

Referring to FIG. 13, a circuit configuration of a latch according to one embodiment of the present disclosure is illustrated. The latch includes a first logic cell, a second logic cell and a first control sub-unit, wherein the second control sub-unit includes a ninth transistor M9. The ninth transistor M9 is an NMOS transistor.

In comparison with the latch illustrated in FIG. 2, the latch as shown in FIG. 13 includes an additional transistor which is the ninth transistor M9.

Drain of the ninth transistor M9 is coupled with the power supply VREF_1, gate of the ninth transistor M9 is coupled with the first input terminal D, and source of the ninth transistor M9 is coupled with the source of the second transistor M2.

Accordingly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be off, the fourth transistor M4 and the sixth transistor M6 will be on, the ninth transistor M9 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 14:
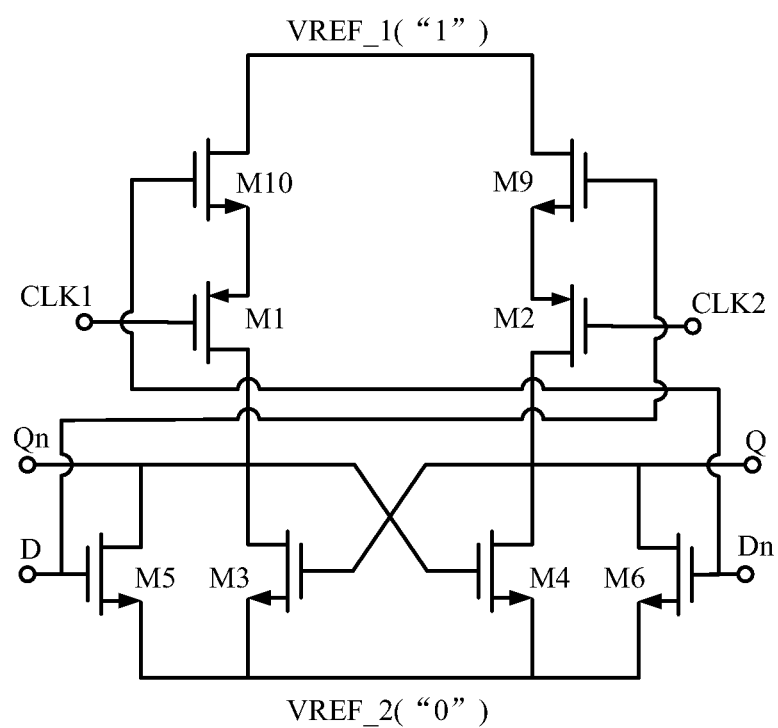

Referring to FIG. 14, a circuit configuration of a latch according to one embodiment of the present disclosure is illustrated. The latch includes a first logic cell, a second logic cell and a first control sub-unit, wherein the second control sub-unit includes a ninth transistor M9 and a tenth transistor M10. The ninth transistor M9 and the tenth transistor M10 are both NMOS transistor.

In comparison with the latch illustrated in FIG. 13, the latch as shown in FIG. 14 includes an additional transistor which is the tenth transistor M9.

Drain of the tenth transistor M10 is coupled with the power supply VREF_1, gate of the tenth transistor M10 is coupled with the second input terminal Dn, and source of the tenth transistor M10 is coupled with the source of the first transistor M1.

Accordingly, when the first control terminal CLK1 and the second control terminal CLK2 are both in low level ("0"), the first transistor M1 and the second transistor M2 are both on. In this case, if make the first input terminal D in high level ("1") and the second input terminal Dn in low level ("0"), the third transistor M3 and the fifth transistor M5 will be off, the tenth transistor will be on, the fourth transistor M4 and the sixth transistor M6 will be on, the ninth transistor M9 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 15:
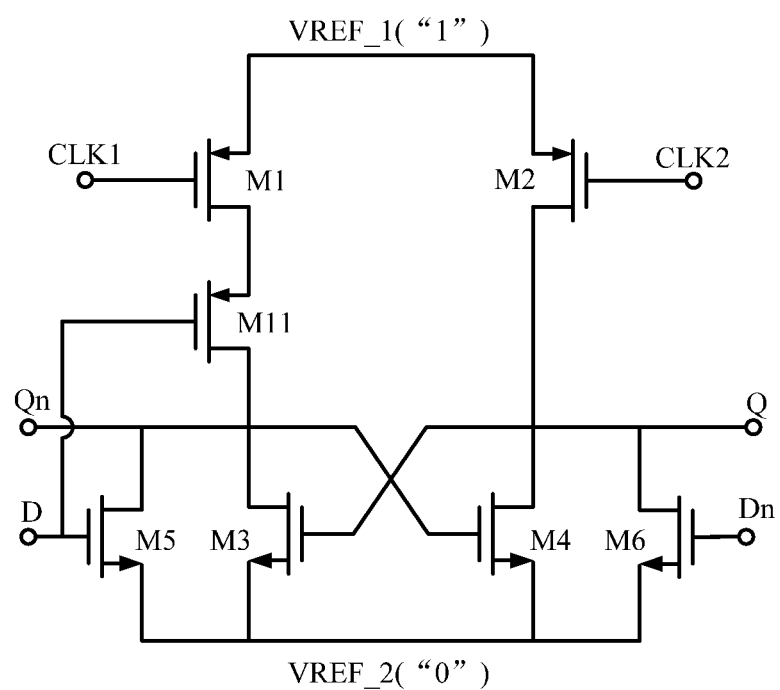

Referring to FIG. 15, a circuit configuration of a latch according to one embodiment of the present disclosure is illustrated. The latch includes a first logic cell, a second logic cell and a third control sub-unit, wherein the third control sub-unit includes an eleventh transistor M11. The eleventh transistor M11 is a PMOS transistor.

In comparison with the latch illustrated in FIG. 2, the latch as shown in FIG. 15 includes an additional transistor which is the eleventh transistor M11.

Source of the eleventh transistor M11 is coupled with the drain of the first transistor M1. Gate of the eleventh transistor M11 is coupled with the first input terminal D. Drain of the eleventh transistor M11 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be off, the eleventh transistor M11 will be on, the fourth transistor M4 and the sixth transistor M6 will be off, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Referring to FIG. 15, a circuit configuration of a latch according to one embodiment of the present disclosure is illustrated. The latch includes a first logic cell, a second logic cell and a third control sub-unit, wherein the third control sub-unit includes an eleventh transistor M11 and a twelfth transistor M12. The eleventh transistor M11 and the twelfth transistor M12 are both PMOS transistor.

Figure 16:
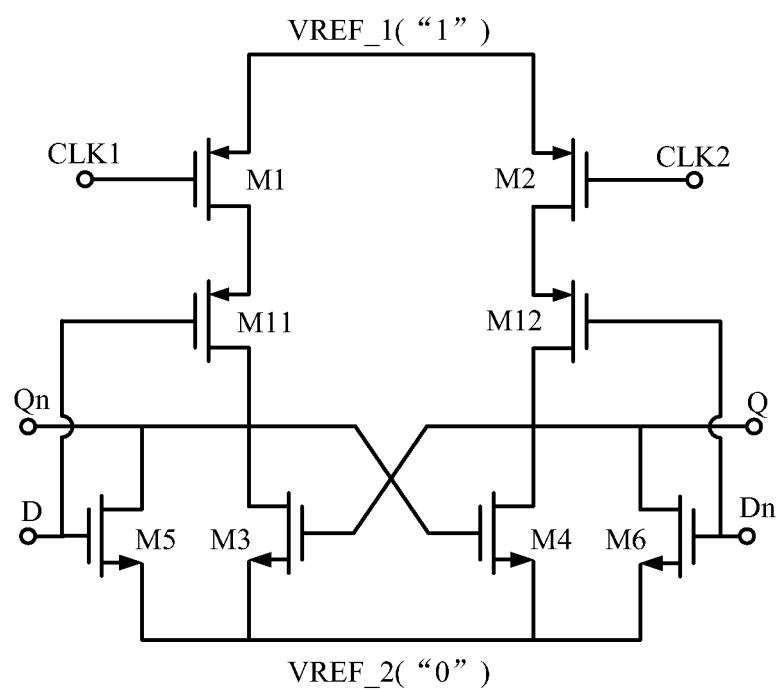

In comparison with the latch illustrated in FIG. 15, the latch as shown in FIG. 16 includes an additional transistor which is the twelfth transistor M12.

Source of the twelfth transistor M12 is coupled with the drain of the second transistor M2. Gate of the twelfth transistor M12 is coupled with the second input terminal Dn. Drain of the twelfth transistor M12 is coupled with the drain of the fourth transistor M4, the drain of the sixth transistor M6, the gate of the third transistor M3, and the second output terminal Q.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be on, the eleventh transistor M11 will be off, the fourth transistor M4 and the sixth transistor M6 will be off, the twelfth transistor M12 will be on, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 17:
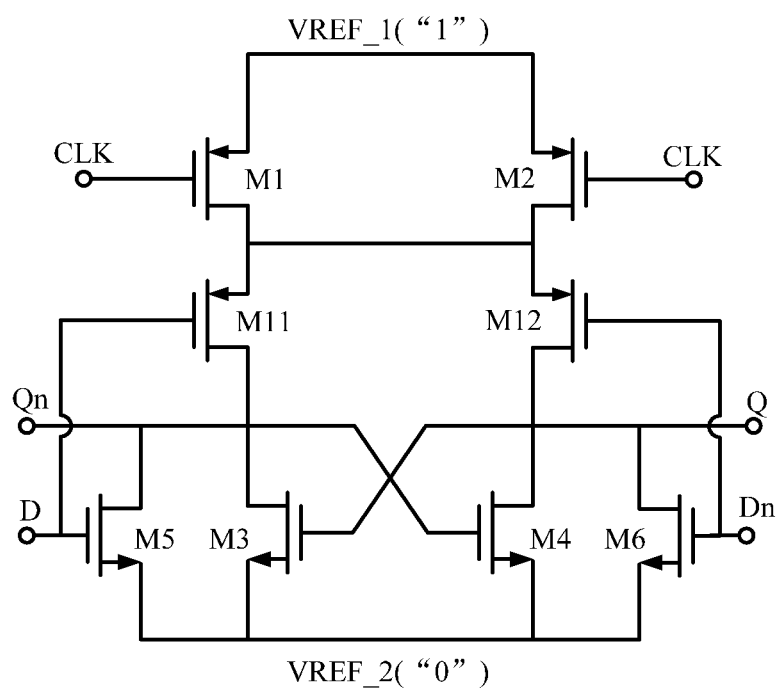

Referring to FIG. 17, a circuit configuration of a latch according to one embodiment of the present disclosure is illustrated. The latch includes a first logic cell, a second logic cell and a third control sub-unit, wherein the third control sub-unit includes an eleventh transistor M11 and a twelfth transistor M12. The eleventh transistor M11 and the twelfth transistor M12 are both PMOS transistor.

The latch as shown in FIG. 17 is a modification of the latch as shown in FIG. 16. Specifically, the source of the eleventh transistor M11 and the source of the twelfth transistor M12 are coupled with each other.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be on, the eleventh transistor M11 will be off, the fourth transistor M4 and the sixth transistor M6 will be off, the twelfth transistor M12 will be on, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 18:
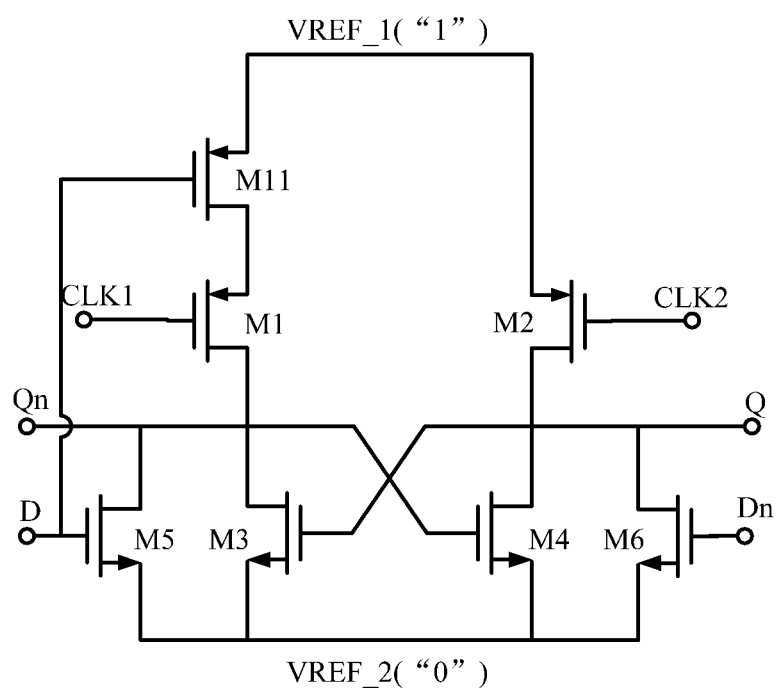

Referring to FIG. 18, a circuit configuration of a latch according to one embodiment of the present disclosure is illustrated. The latch includes a first logic cell, a second logic cell and a third control sub-unit, wherein the third control sub-unit includes an eleventh transistor M11. The eleventh transistor M11 is a PMOS transistor.

In comparison with the latch illustrated in FIG. 2, the latch as shown in FIG. 18 includes an additional transistor which is the eleventh transistor M11.

Source of the eleventh transistor M11 is coupled with the power supply VREF_1, gate of the eleventh transistor M11 is coupled with the first input terminal D, and drain of the eleventh transistor M11 is coupled with the source of the first transistor M1.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be on, the eleventh transistor M11 will be off, the fourth transistor M4 and the sixth transistor M6 will be off, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 19:
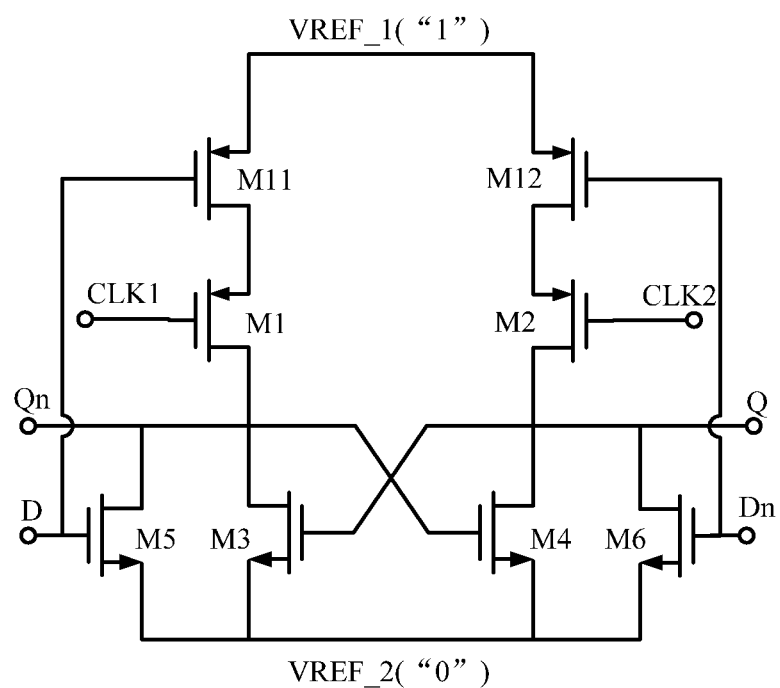

Referring to FIG. 19, a circuit configuration of a latch according to one embodiment of the present disclosure is illustrated. The latch includes a first logic cell, a second logic cell and a third control sub-unit, wherein the third control sub-unit includes an eleventh transistor M11 and a twelfth transistor M12. The eleventh transistor M11 and the twelfth transistor M12 are both PMOS transistor.

In comparison with the latch illustrated in FIG. 18, the latch as shown in FIG. 19 includes an additional transistor which is the twelfth transistor M12.

Source of the twelfth transistor M12 is coupled with the power supply VREF_1, gate of the twelfth transistor M12 is coupled with the second input terminal Dn, and drain of the twelfth transistor M12 is coupled with the source of the second transistor M2.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be on, the eleventh transistor M11 will be off, the fourth transistor M4 and the sixth transistor M6 will be off, thus a first current path from the power supply VREF_1 to the first transistor M1, the third transistor M3/the fifth transistor M5, and the ground wire VREF_2 will be cut off, wherein the first current path is in the first logic cell. Therefore, when the first control terminal CLK1 and the second control terminal CLK2 are both in low level, the static loss of the latch will be eliminated, and the dynamic loss of the latch will be dramatically reduced.

Figure 20:
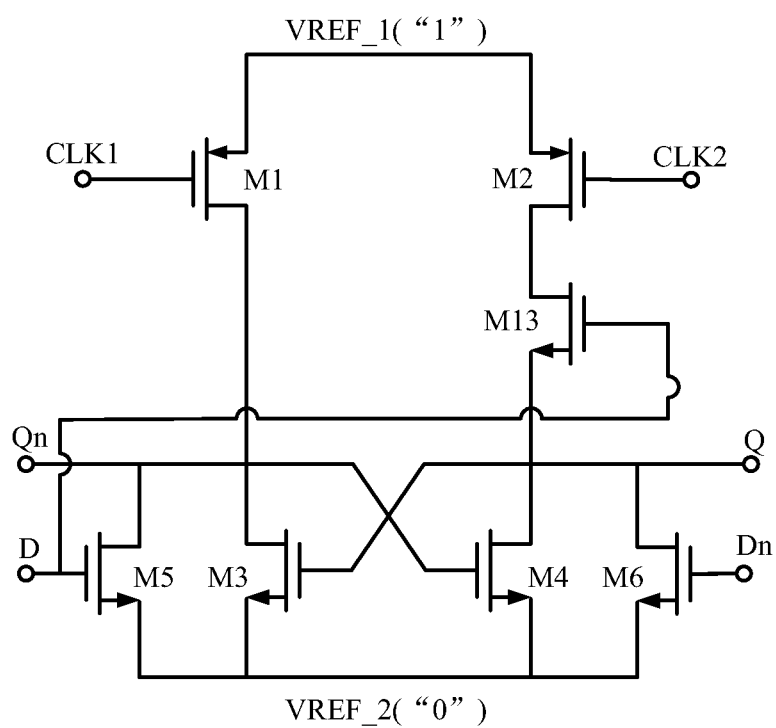

Referring to FIG. 20, a circuit configuration of a latch according to one embodiment of the present disclosure is illustrated. The latch includes a first logic cell, a second logic cell and a fourth control sub-unit, wherein the fourth control sub-unit includes an thirteenth transistor M13.

In comparison with the latch illustrated in FIG. 2, the latch as shown in FIG. 20 includes an additional transistor which is the thirteenth transistor M13. Furthermore, the thirteenth transistor M13 is an NMOS transistor.

Drain of the thirteenth transistor M13 is coupled with the drain of the second transistor M2. Gate of the thirteenth transistor M13 is coupled with the first input terminal D. Source of the thirteenth transistor M13 is coupled with the drain of the fourth transistor M4, the drain of the sixth transistor M6, the gate of the third transistor M3, and the second output terminal Q.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be off, the fourth transistor M4 and the sixth transistor M6 will be on, the thirteenth transistor M13 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 21:
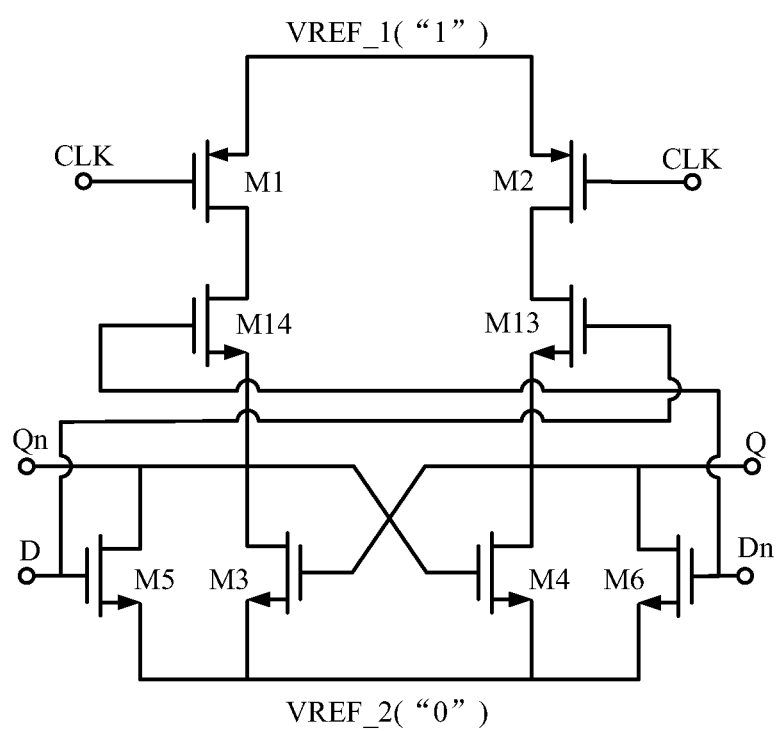

Referring to FIG. 21, a circuit configuration of a latch according to one embodiment of the present disclosure is illustrated. The latch includes a first logic cell, a second logic cell and a fourth control sub-unit, wherein the fourth control sub-unit includes an fourteenth transistor M14.

In comparison with the latch illustrated in FIG. 20, the latch as shown in FIG. 21 includes an additional transistor which is the fourteenth transistor M14. Furthermore, the fourteenth transistor M14 is an NMOS transistor.

Drain of the fourteenth transistor M14 is coupled with the drain of the first transistor M1. Gate of the fourteenth transistor M14 is coupled with the second input terminal Dn. Source of the fourteenth transistor M14 is coupled with the drain of the third transistor M3, the drain of the fifth transistor M5, the gate of the fourth transistor M4, and the first output terminal Qn.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be off, the fourteenth transistor M14 will be on, the fourth transistor M4 and the sixth transistor M6 will be on, the thirteenth transistor M13 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 22:
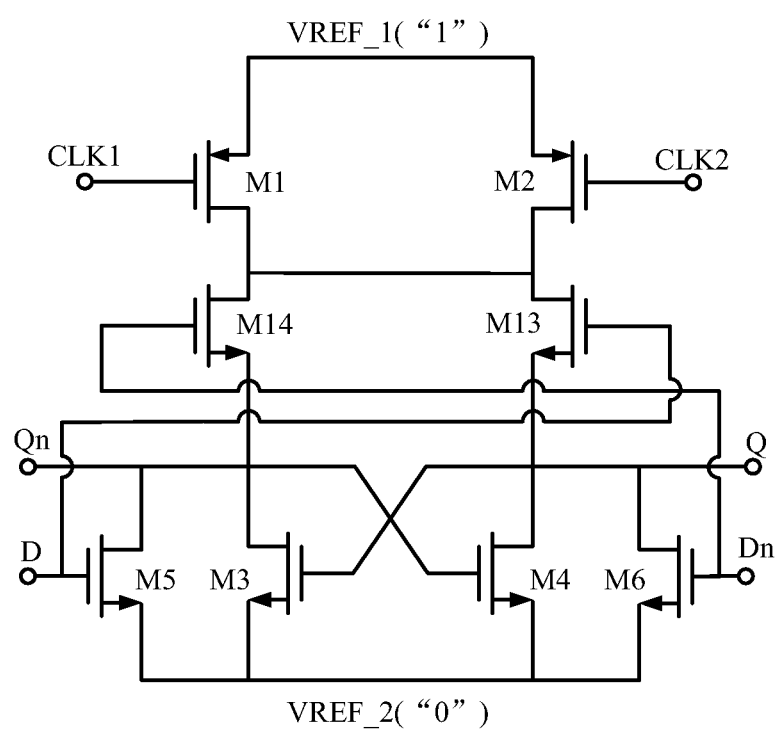

Referring to FIG. 22, a circuit configuration of a latch according to one embodiment of the present disclosure is illustrated. The latch includes a first logic cell, a second logic cell and a fourth control sub-unit, wherein the fourth control sub-unit includes a thirteenth transistor M13 and a fourteenth transistor M14.

The latch as shown in FIG. 22 is a modification of the latch as shown in FIG. 21. Specifically, the drain of the thirteenth transistor M13 and the drain of the fourteenth transistor M14 are coupled with each other.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be off, the fourteenth transistor M14 will be on, the fourth transistor M4 and the sixth transistor M6 will be on, the thirteenth transistor M13 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 23:
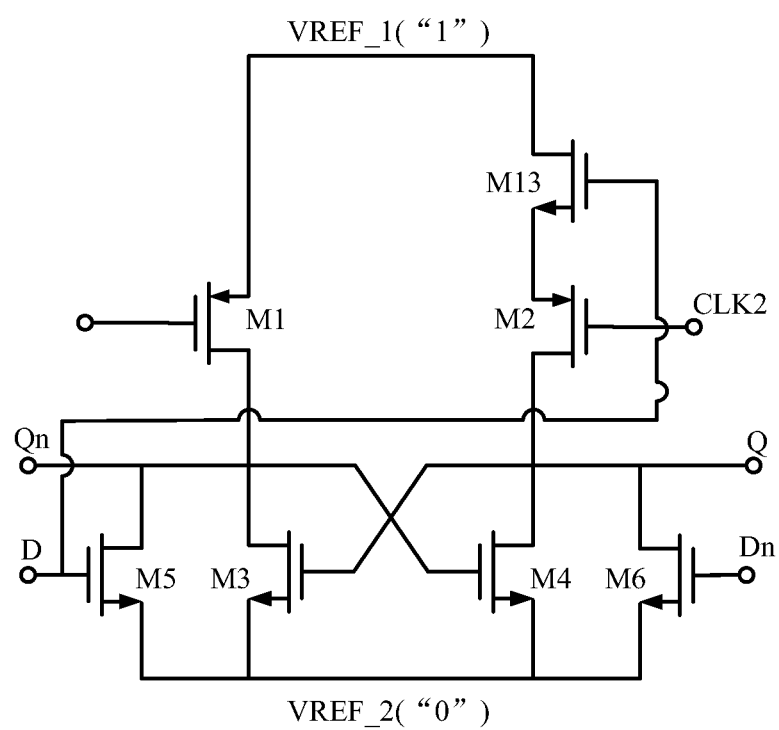

Referring to FIG. 23, a circuit configuration of a latch according to one embodiment of the present disclosure is illustrated. The latch includes a first logic cell, a second logic cell and a fourth control sub-unit, wherein the fourth control sub-unit includes a thirteenth transistor M13.

In comparison with the latch illustrated in FIG. 2, the latch as shown in FIG. 23 includes an additional transistor which is the thirteenth transistor M13. Furthermore, the thirteenth transistor M13 is an NMOS transistor.

Drain of the thirteenth transistor M13 is coupled with the power supply VREF_1, gate of the thirteenth transistor M13 is coupled with the first input terminal D, and source of the thirteenth transistor M13 is coupled with the source of the second transistor M2.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be off, the fourth transistor M4 and the sixth transistor M6 will be on, the thirteenth transistor M13 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Figure 24:
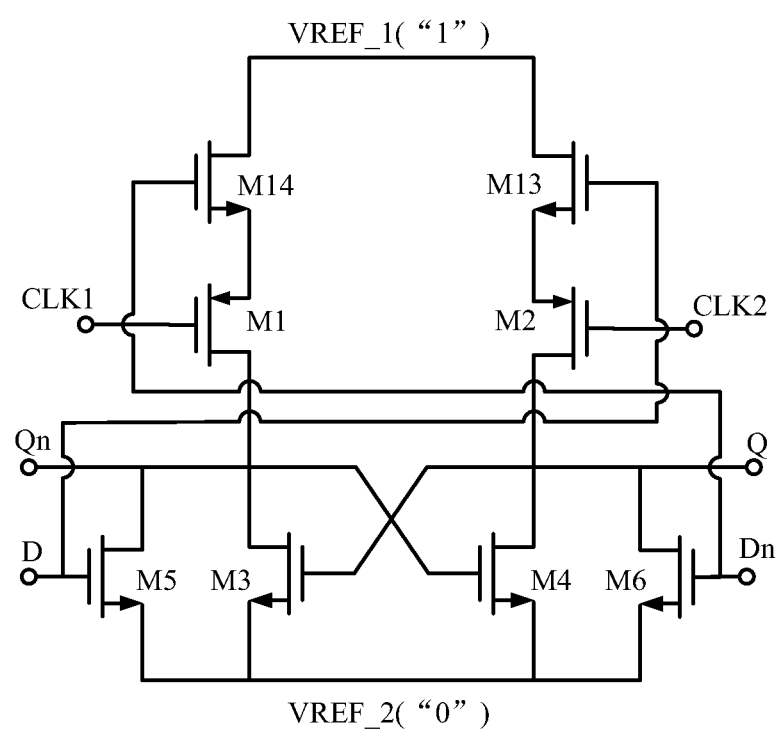

Referring to FIG. 24, a circuit configuration of a latch according to one embodiment of the present disclosure is illustrated. The latch includes a first logic cell, a second logic cell and a fourth control sub-unit, wherein the fourth control sub-unit includes a fourteenth transistor M14.

In comparison with the latch illustrated in FIG. 23, the latch as shown in FIG. 24 includes an additional transistor which is the fourteenth transistor M14. Furthermore, the fourteenth transistor M14 is an NMOS transistor.

Drain of the fourteenth transistor M14 is coupled with the power supply VREF_1, gate of the fourteenth transistor M14 is coupled with the second input terminal Dn, and source of the fourteenth transistor M14 is coupled with the source of the first transistor M1.

Accordingly, when the first control terminal CLK1 and the second control terminal CLK2 are both in low level ("0"), the first transistor M1 and the second transistor M2 are both on. In this case, if make the first input terminal D in low level ("0") and the second input terminal Dn in high level ("1"), the third transistor M3 and the fifth transistor M5 will be off, the fourteenth transistor M14 will be on, the fourth transistor M4 and the sixth transistor M6 will be on, the thirteenth transistor M13 will be off, thus a second current path from the power supply VREF_1 to the second transistor M2, the fourth transistor M4/the sixth transistor M6, and the ground wire VREF_2 will be cut off, wherein the second current path is in the second logic cell. Therefore, when the first control terminal CLK1 and the second control terminal CLK2 are both in low level, the static loss of the latch will be eliminated, and the dynamic loss of the latch will be dramatically reduced.

Accordingly, a frequency divider is also provided by the present disclosure, which includes at least two of the latches as illustrated above. For example, the frequency divider may include two latches which is a first latch and a second latch, wherein a first input terminal and a second input terminal of the first latch is respectively coupled with a first output terminal and a second output terminal of the second latch.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A latch, comprising:
   a first logic cell coupled between a power supply and a ground wire, which has a first control terminal, a first input terminal and a first output terminal;
   a second logic cell having a structure symmetrical to that of the first logic cell, which has a second control terminal, a second input terminal and a second output terminal; and
   a feedforward control unit adapted to control the first logic cell or the second logic cell based on signals inputted into the first input terminal and the second input terminal,
   wherein the first control sub-unit is adapted to cut off a first current circuit in the first logic cell, when the signal inputted into the first input terminal is in high level and the signal inputted into the second input terminal is in low level;
   wherein the second control sub-unit is adapted to cut off a second current circuit in the second logic cell, when the signal inputted into the first input terminal is in high level and the signal inputted into the second input terminal is in low level;
   wherein the third control sub-unit is adapted to cut off the first current circuit in the first logic cell, when the signal inputted into the first input terminal is in low level and the signal inputted into the second input terminal is in high level; and
   wherein the fourth control sub-unit is adapted to cut off the second current circuit in the second logic cell, when the signal inputted into the first input terminal is in low level and the signal inputted into the second input terminal is in high level.

2. The latch according to claim 1, wherein the first logic cell comprises a first transistor, a third transistor and a fifth transistor;
   wherein the second logic cell comprises a second transistor, a fourth transistor and a sixth transistor;
   wherein a source of the first transistor is coupled with the power supply, a gate of the first transistor is coupled with the first control terminal, a drain of the first transistor is coupled with a drain of the third transistor, a drain of the fifth transistor, a gate of the fourth transistor and the first output terminal;
   wherein a source of the second transistor is coupled with the power supply, a gate of the second transistor is coupled with the second control terminal, a drain of the second transistor is coupled with a drain of the fourth transistor, a drain of the sixth transistor, a gate of the third transistor and the second output terminal; and
   wherein sources of the third transistor, the fourth transistor, the fifth transistor and the sixth transistor are coupled with the ground wire.

3. The latch according to claim 2, wherein the first control sub-unit comprises a seventh transistor which is a PMOS transistor; and
   wherein a source of the seventh transistor is coupled with the drain of the first transistor, a gate of the seventh transistor is coupled with the first input terminal, a drain of the seventh transistor is coupled with the drain of the third transistor, the drain of the fifth transistor, the gate of the fourth transistor and the first output terminal.

4. The latch according to claim 3, wherein the first control sub-unit further comprises an eighth transistor which is a PMOS transistor; and wherein a source of the eighth transistor is coupled with the drain of the second transistor, a gate of the eighth transistor is coupled with the second input terminal, a drain of the eighth transistor is coupled with the drain of the fourth transistor, the drain of the sixth transistor, the gate of the third transistor and the second output terminal.

5. The latch according to claim 4, wherein the source of the seventh transistor and the source of the eighth transistor are coupled with each other.

6. The latch according to claim 2, wherein the first control sub-unit comprises a seventh transistor which is a PMOS transistor; and wherein a source of the seventh transistor is coupled with the power supply, a gate of the seventh transistor is coupled with the first input terminal, a drain of the seventh transistor is coupled with the source of the first transistor.

7. The latch according to claim 6, wherein the first control sub-unit further comprises an eighth transistor which is a PMOS transistor; and wherein a source of the eighth transistor is coupled with the power supply, a gate of the eighth transistor is coupled with the second input terminal, a drain of the eighth transistor is coupled with the source of the second transistor.

8. The latch according to claim 2, wherein the second control sub-unit comprises a ninth transistor which is an NMOS transistor; and wherein a drain of the ninth transistor is coupled with the drain of the second transistor, a gate of the ninth transistor is coupled with the first input terminal, a source of the ninth transistor is coupled with the drain of the fourth transistor, the drain of the sixth transistor, the gate of the third transistor and the second output terminal.

9. The latch according to claim 8, wherein the second control sub-unit further comprises a tenth transistor which is an NMOS transistor; and wherein a drain of the tenth transistor is coupled with the drain of the first transistor, a gate of the tenth transistor is coupled with the second input terminal, a source of the tenth transistor is coupled with the drain of the third transistor, the drain of the fifth transistor, the gate of the fourth transistor and the first output terminal.

10. The latch according to claim 9, wherein the drain of the ninth transistor and the source of the tenth transistor are coupled with each other.

11. The latch according to claim 2, wherein the second control sub-unit comprises a ninth transistor which is an NMOS transistor; and wherein a drain of the ninth transistor is coupled with the power supply, a gate of the ninth transistor is coupled with the first input terminal, a source of the ninth transistor is coupled with the source of the second transistor.

12. The latch according to claim 11, wherein the second control sub-unit further comprises a tenth transistor which is an NMOS transistor; and wherein a drain of the tenth transistor is coupled with the power supply, a gate of the tenth transistor is coupled with the second input terminal, a source of the tenth transistor is coupled with the source of the first transistor.

13. The latch according to claim 2, wherein the third control sub-unit comprises an eleventh transistor which is a PMOS transistor; and wherein a source of the eleventh transistor is coupled with the drain of the first transistor, a gate of the eleventh transistor is coupled with the first input terminal, a drain of the eleventh transistor is coupled with the drain of the third transistor, the drain of the fifth transistor, the gate of the fourth transistor and the first output terminal.

14. The latch according to claim 13, wherein the third control sub-unit further comprises a twelfth transistor which is a PMOS transistor; and wherein a source of the twelfth transistor is coupled with the drain of the second transistor, a gate of the twelfth transistor is coupled with the second input terminal, a drain of the twelfth transistor is coupled with the drain of the fourth transistor, the drain of the sixth transistor, the gate of the third transistor and the second output terminal.

15. The latch according to claim 14, wherein the source of the eleventh transistor and the source of the twelfth transistor are coupled with each other.

16. The latch according to claim 2, wherein the third control sub-unit comprises an eleventh transistor which is a PMOS transistor; and wherein a source of the eleventh transistor is coupled with the power supply, a gate of the eleventh transistor is coupled with the first input terminal, a drain of the eleventh transistor is coupled with the source of the first transistor.

17. The latch according to claim 16, wherein the third control sub-unit further comprises a twelfth transistor which is a PMOS transistor; and wherein a source of the twelfth transistor is coupled with the power supply, a gate of the twelfth transistor is coupled with the second input terminal, a drain of the twelfth transistor is coupled with the source of the second transistor.

18. The latch according to claim 2, wherein the fourth control sub-unit comprises a thirteenth transistor which is an NMOS transistor; and wherein a drain of the thirteenth transistor is coupled with the drain of the second transistor, a gate of the thirteenth transistor is coupled with the first input terminal, a source of the thirteenth transistor is coupled with the drain of the fourth transistor, the drain of the sixth transistor, the gate of the third transistor and the second output terminal.

19. The latch according to claim 18, wherein the fourth control sub-unit further comprises a fourteenth transistor which is an NMOS transistor; and wherein a drain of the fourteenth transistor is coupled with the drain of the first transistor, a gate of the fourteenth transistor is coupled with the second input terminal, a source of the fourteenth transistor is coupled with the drain of the third transistor, the drain of the fifth transistor, the gate of the fourth transistor and the first output terminal.

20. The latch according to claim 19, wherein the drain of the thirteenth transistor and the drain of the fourteenth transistor are coupled with each other.

21. The latch according to claim 2, wherein the fourth control sub-unit comprises a thirteenth transistor which is an NMOS transistor; and wherein a drain of the thirteenth transistor is coupled with the power supply, a gate of the thirteenth transistor is coupled with the first input terminal, a source of the thirteenth transistor is coupled with the source of the second transistor.

22. The latch according to claim 16, wherein the third control sub-unit further comprises a fourteenth transistor which is an NMOS transistor; and wherein a drain of the fourteenth transistor is coupled with the power supply, a gate of the fourteenth transistor is coupled with the second input terminal, a source of the fourteenth transistor is coupled with the source of the first transistor.

23. A frequency divider, comprising at least two of the latches according to claim 1, wherein the at least two of the latches comprises a first latch and a second latch, the first input terminal and the second input terminal of the first latch are respectively coupled with the first output terminal and the second output terminal of the second latch.

* * * * *